United States Patent Office 2,954,308

Patented Sept. 27, 1960

2,954,308

SEMICONDUCTOR IMPURITY DIFFUSION

Vincent J. Lyons, Wappingers Falls, N.Y., assignor to International Business Machines Corporation, New York, N.Y., a corporation of New York No Drawing. Filed May 27, 1957, Ser. No. 661,617

1 Claim. (Cl. 148—1.5)

This invention relates to semiconductor materials and in particular to a process of making monoatomic N type conductivity semiconductor material wherein selected quantities of some elements of the main group VI elements of the periodic table serve as donor impurities. This application is a continuation in part of application Serial Number 585,945, filed May 21, 1956, entitled "Semiconductor Alloy," now abandoned.

A semiconductor material has been defined in the art as a material in which electrical conduction takes place as a result of migration of carriers known as electrons and holes, throughout the material.

To produce the various semiconductor effects, an example of which is transistor action, it is advantageous to permit the migration of these carriers to proceed uninterrupted as far as possible. For this reason many semiconductor materials are of the type that will form a diamond type, single crystalline structure, containing a minimum of imperfections that can serve to impede the migration of the carriers. The main group IV semiconductor elements of the periodic table form a diamond type crystalline structure. In semiconductor material in which the majority of the carriers are electrons, the conductivity of the material is considered to be N type and in semiconductor material wherein the majority of the carriers are holes, the conductivity of the material is considered to be P type. The conductivity type of a semiconductor material is established by existing elemental impurities and by preferentially introducing into the bulk of the semiconductor material significant quantities of elements known as impurities, the atomic structure of which is so related to the bulk material that carriers are introduced into the material. The net quantity of one type of carrier over the quantity of the opposite type of carrier present in the crystal determines the resistivity of the semiconductor material. The effect of these impurity elements on the conductivity and resistivity of the bulk element is very pronounced so that extremely small quantities of them may produce a large change in the characteristics of the resulting semiconductor material. It is established in the art that one impurity atom in ten million bulk atoms is sufficient to alter the characteristics of a semiconductor material.

Semiconductor materials comprising a bulk constituent and a small but significant quantity of an impurity constituent have been referred to in the art as alloys although the quantity of the impurity constituent present is so small that it could be considered only a trace.

It has been discovered that an "alloy" comprising as a bulk constituent one or more of certain of the main group IV semiconductor elements of the periodic table and as an impurity constituent one or more of certain of the main group VI elements of the periodic table will serve as N conductivity type semiconductor material and that the process of introducing these impurities requires special care.

The main group IV semiconductor elements of the periodic table are known in the art as carbon, silicon, germanium, and tin. The main group VI elements of the periodic table, are known in the art as oxygen, sulfur, selenium, tellurium and polonium.

Accordingly, a primary object of this invention is to provide an improved method of making an N conductivity type semiconductor alloy.

Another object of this invention is to provide an improved method of making a semiconductor alloy comprising as a bulk constituent one or more of certain of the main group IV semiconductor elements and as an impurity constituent one or more of certain of the main group VI elements.

Other objects of the invention will be pointed out in the following description and claims which disclose, by way of example, the principle of the invention and the best mode, which has been contemplated, of applying that principle.

In the method of making the semiconductor alloy of this invention, significant quantities of one or more of certain of the main group VI elements of the periodic table are introduced as an impurity into a bulk material comprising one or more of certain elements of the main group IV of the periodic table. At the present state of semiconductor technology, germanium and silicon are the preferred elements of the main group IV for general semiconductor use. These two elements have a single allotropic form and they have a diamond type crystalline structure over the normal range of temperatures. The element carbon has more than one allotropic form, one of which has a diamond type crystalline structure having properties that are suitable for semiconductor applications at high temperatures. The element tin also has more than one allotropic form, one of which, grey tin, has a diamond type crystalline structure that has properties that are suitable for semiconductor applications at lower temperatures. Both the diamond allotropic form of carbon and grey tin require temperatures for semiconductor use that are beyond the normal range.

The atoms of the elements of the main group IV have four valence electrons which form covalent bonds with adjacent atoms so that all available electrons are used and large single diamond structure crystals of these elements may be formed. The atoms of the elements of the main group VI have six valence electrons and these atoms, in addition to providing four electrons for covalent bonds with adjacent atoms of the bulk material, have two unused electrons which can constribute to current conduction. The presence of these electrons as current carriers in the bulk material gives the resulting alloy N type conductivity. Of the elements of the main group VI namely oxygen, sulfur, selenium, tellurium and polonium, the elements sulfur, selenium and tellurium, are stable and are solid at room temperature, and have been found to impart N conductivity typ to germanium and silicon. Theory indicates that oxygen would also provide the necessary electrons to produce N type conductivity. Oxygen is a gas at normal temperatures and becomes a liquid at −218.4° C. The element polonium is unstable as far as is known. Since the atoms of both silicon and germanium have four valence electrons diamond type crystal structures made up of germanium or silicon singly or of a combination of germanium and silicon atoms can serve as the bulk constituent and since the atoms of all three elements sulfur, selenium and tellurium have six valence electrons, these elements singly or in combination can serve as the impurity constituent in semiconductor material.

The proportions of impurity constituent to bulk constituent present in the alloy of this invention is generally on the order of less than one percent of impurity constituent and more than ninety-nine percent bulk constituent. The factors governing the proportions are the purity of the bulk constituent and the desired resistivity of the resulting semiconductor alloy. Taking a particular example, a melt of germanium containing sufficient contaminant or impurity ingredients to render it to have a P type conductivity and a resistivity of three ohm centimeters may be converted to the N type conductivity alloy of this invention with the addition of approximately .00007% selenium resulting in a resistivity of two ohm centimeters.

The impurity constituent may preferably be introduced into and distributed through the bulk constituent of the semiconductor material through a technique of diffusion.

In the diffusion technique of this invention, the bulk constituent is heated to a temperature sufficient to give a relatively high diffusion rate. The atoms of the impurity material diffuse into the bulk material from a surface compound of semiconductor material and the impurity element which serves as a source of supply. The technology of diffusion is critical with respect to the concentration of the impurity constituent in the vapor environment.

It has been found that diffusion of the main group VI impurities (sulphur, selenium and tellurium) into silicon and germanium can be performed with superior results by incorporating certain requirements into the diffusion operation. The conditions to be controlled are as follows, use a sealed or static system in which the material and the environment are contained in a closed vessel, maintain the concentration of the impurity in the environment on the surface of the material at a relatively low value (on the order of $10^{14}$ to $10^{18}$ atoms per cubic centimeter), position the material at the point of lowest temperature in the system (a few tenths of a degree will satisfy this requirement), and limit the duration of the diffusion time to a value not exceeding 40 hours when temperatures sufficient for reasonably rapid diffusion are employed. The control of these conditions permits diffusion of the main group VI elements into the semiconductor material from the surface to very closely controllable depths and to very accurately predictable resistivity values. It should be noted that a gradient of resistivity will be produced in the semiconductor material as a result of this diffusion.

The exact chemical mechanism whereby the diffusion takes place under the above conditions is not completely understood and the following discussion is advanced as a guide to a possible chemical mechanism explaining the need for control of the above conditions.

The major difficulty encountered in main group VI impurity diffusion is believed to be compound formation between the impurity and the semiconductor material. A volatile impurity-semiconductor compound is formed on the semiconductor material surface. This compound volatilizes at the diffusion temperature and this has the effect of removing some of the semiconductor material from the quantity undergoing diffusion. If a part of the reaction vessel is somewhat cooler than the semiconductor material the volatile impurity-semiconductor compound will condense at this cooler spot and an equilibrium will be established between the solid or liquid and the gaseous phase of the compound. Eventually all of the impurity in the system will be reacted with the semiconductor material leaving no impurity for diffusion into the quantity of semiconductor material undergoing diffusion. The requirement of maintaining the semiconductor material at the coolest point in the system operates to keep the volatile compound on the semiconductor material surface except for that portion which is in the gaseous phase thereby reducing the transfer and condensation. This, coupled with the use of a static or sealed vessel type system acts to further reduce the relative motion of the gaseous phase with respect to the semiconductor material so that no appreciable loss of the semiconductor material in impurity-semiconductor compound will occur and conditions will be set up in the system with impurity still available for diffusion. Any point in the system that is cooler than the remainder, however small the difference in temperature, will be adequate to prevent the transfer. In practice, in most furnaces there is one point that is cooler than the remainder without the necessity of using specially cooled location.

If the diffusion operation is conducted for a long period of time, for example in excess of 40 hours, at temperatures for reasonably rapid diffusion, a shift of equilibrium between the solid or liquid and the gaseous phases of the compound in the static system is believed to occur in the direction of reduction of available impurity for diffusion so that no conductivity type conversion will take place. Through the requirement of maintaining at a low value the concentration of impurity in the environment in the static system, the volatile compound formation and subsequent loss of semiconductor material to the environment can be minimized, since through the use of a relatively low impurity concentration, the volatile compound formation is reduced through the reduction of the source of one of the ingredients of the compound while at the same time enough compound is present on the surface of the material to permit reasonably rapid diffusion.

A discussion of the subject of diffusion appears in the following reference: "Diffusion in and Through Solids," by R. M. Barrer, Cambridge University Press.

The following table of data is presented as Table 1 to illustrate the order of magnitude of the parameters involved in practicing the diffusion of this invention. This information is presented only to facilitate the understanding and practicing of the invention and in view of the wide range of influencing factors involved in the technology, the values here presented should not be construed as a limitation. The table presents temperature, time, P–N junction depth and environmental conditions for each of the preferred main group VI elements into each of the preferred main group IV semiconductor elements at a given vapor concentration. In each of the six cases tabulated the introduction of the impurity constituent produces N type conductivity to the P–N junction depth.

*Table 1*

| Bulk Constituent (P-type) | Impurity Constituent | Concentration of Impurity in Vapor | Atmosphere | Pressure in mm. of Hg at Room Temp., Approx. | Temperature of Diffusion, ° C., Approx. | Duration of Diffusion, Hours, Approx. | P–N Junction Depth, Inches, Approx. |
|---|---|---|---|---|---|---|---|
| Germanium | Sulfur | $10^{16}$ to $10^{17}$ atoms/cc. | Argon | 300 | 800 | 25 | .0027 |
| Do | Selenium | do | do | 300 | 800 | 23 | .0015 |
| Do | Tellurium | do | do | 1,500 | 800 | 16 | .001 |
| Silicon | Sulfur | do | do | 300 | 950 | 17 | .0005 |
| Do | Selenium | do | do | 300 | 950 | 17 | .0005 |
| Do | Tellurium | do | do | 1,500 | 950 | 18 | .0005 |

It has been discovered that the resistivity gradient in the region of N type conductivity produced by the above described diffusion operation is not as steep as the gradient that has been found in past practice wherein the main group V elements of the periodic table have been employed as the impurity constituent. This change in slope of the resistivity gradient is of advantage in semiconductor device fabrication. Since the resistivity of the region of a semiconductor crystal is a controlling factor in the performance of the device made therefrom a reduction in slope in the resistivity gradient renders the positioning of contacts less critical. This feature of the alloy of this invention is of particular advantage in the fabrication of graded resistivity base type transistors for example of the type illustrated in U.S. Patent No. 2,810,870.

In the above discussion of techniques of forming semiconductor alloys of this invention only the points in the technology that have a particular bearing on the introduction of the elements of the main group VI that are solid at room temperature into germanium or silicon have been stressed. It should be noted, however, that the quantity of the impurity constituent or of a contaminant, sufficiently large to be significant, is generally too small to be detected by spectroscopic means and for this reason it is standard practice in the art to practice extreme care in all stages of a semiconductor fabrication process to preserve the proper degree of purity.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention, therefore, to be limited only as indicated by the scope of the following claim.

What is claimed is:

The process of diffusing a conductivity type directing impurity constituent of the group consisting of sulfur, selenium and tellurium into a semiconductor bulk constituent material of the group consisting of germanium and silicon comprising, in combination, the steps of positioning a quantity of said bulk constituent material in a sealed vessel and heating said vessel and said material to a temperature in the range of 600° C. to the melting point of said bulk constituent in a position such that said material is at the coolest point in said vessel for a time not to exceed 40 hours while maintaining in an inert atmosphere in said vessel a concentration of said impurity constituent in the range of $10^{14}$ to $10^{18}$ atoms per cubic centimeter.

References Cited in the file of this patent

UNITED STATES PATENTS

| | | |
|---|---|---|
| 2,784,121 | Fuller | Mar. 5, 1957 |
| 2,790,940 | Prince | Apr. 30, 1957 |
| 2,809,165 | Jenny | Oct. 8, 1957 |
| 2,862,787 | Seguin et al. | Dec. 2, 1958 |
| 2,898,248 | Silvey et al. | Aug. 4, 1959 |

FOREIGN PATENTS

| | | |
|---|---|---|
| 203,695 | Australia | Sept. 29, 1955 |

OTHER REFERENCES

Transistor Technology, Western Electric Company, Inc., 1952, pages 155–158.